United States Patent
Park et al.

(10) Patent No.: US 7,585,763 B2
(45) Date of Patent: Sep. 8, 2009

(54) METHODS OF FABRICATING INTEGRATED CIRCUIT DEVICES USING ANTI-REFLECTIVE COATING AS IMPLANT BLOCKING LAYER

(75) Inventors: Sang Jine Park, Fishkill, NY (US); Chong Kwang Chang, Fishkill, NY (US); Seok-Gyu Lee, Fishkill, NY (US); Lothar Doni, Fishkill, NY (US)

(73) Assignees: Samsung Electronics Co., Ltd. (KR); Infineon Technologies AG (DE)

( * ) Notice: Subject to any disclaimer, the term of this patent is extended or adjusted under 35 U.S.C. 154(b) by 401 days.

(21) Appl. No.: 11/267,980

(22) Filed: Nov. 7, 2005

(65) Prior Publication Data

US 2007/0105293 A1   May 10, 2007

(51) Int. Cl.
*H01L 21/4763* (2006.01)
(52) U.S. Cl. .............. 438/636; 438/301; 438/510; 438/622; 257/E21.32; 257/E21.135; 257/E21.229; 257/E21.248; 257/E21.561
(58) Field of Classification Search ........... 438/197, 438/199, 301, 311, 506, 510, 622, 636, 63, 438/673, 706, 745
See application file for complete search history.

(56) References Cited

U.S. PATENT DOCUMENTS

| | | | | |
|---|---|---|---|---|
| 5,908,307 A * | 6/1999 | Talwar et al. | ............... | 438/199 |
| 5,962,195 A * | 10/1999 | Yen et al. | ............... | 430/316 |
| 6,258,644 B1 * | 7/2001 | Rodder et al. | ............... | 438/199 |
| 6,395,624 B1 * | 5/2002 | Bruce et al. | ............... | 438/535 |
| 6,432,763 B1 | 8/2002 | Yu | | |
| 6,492,701 B1 | 12/2002 | Kim et al. | | |
| 6,806,156 B2 * | 10/2004 | Lenoble et al. | ............. | 438/303 |
| 6,974,999 B2 | 12/2005 | Sugihara | | |
| 2005/0255641 A1 | 11/2005 | Sugihara | | |

FOREIGN PATENT DOCUMENTS

| | | |
|---|---|---|
| EP | 0 945 897 A1 | 9/1999 |
| JP | 5-299434 A | 11/1993 |
| JP | 11-312740 A | 11/1999 |
| JP | 2003-258245 A | 9/2003 |
| KR | 2000-0003724 A | 1/2000 |
| KR | 2000-0061464 A | 10/2000 |
| KR | 2000-0071335 A | 11/2000 |

OTHER PUBLICATIONS

Notice of Allowance, KR 10-2006-0091300, Nov. 28, 2007.
Shao et al., "Wet-Developable Organic Anti-Reflective Coatings for Implant Layer Applications", *SEMICON China 2004*, SEMI Technology Symposium on Mar. 17, 2004 at the RiverFront Business Hotel, Pudong, Shanghai, 9 pp.

* cited by examiner

*Primary Examiner*—David Nhu
(74) *Attorney, Agent, or Firm*—Myers Bigel Sibley & Sajovec, P.A.

(57) ABSTRACT

A patterned anti-reflective coating may be used as a selective implant-blocking layer during fabrication of an integrated circuit transistor. In particular, the anti-reflective coating may be used as a gate sidewall spacer to block at least some dopants from an integrated circuit substrate beneath the gate sidewall spacer. Moreover, a single mask may be used when fabricating source and drain extension regions and source and drain regions of an integrated circuit transistor.

15 Claims, 4 Drawing Sheets

METHODS OF FABRICATING INTEGRATED CIRCUIT DEVICES USING ANTI-REFLECTIVE COATING AS IMPLANT BLOCKING LAYER

FIELD OF THE INVENTION

This invention relates to integrated circuit fabrication, and more particularly to implantation processes that are used to fabricate integrated circuits.

BACKGROUND OF THE INVENTION

Integrated circuits are widely used in many consumer, commercial and other applications. As is well known to those having skill in the art, an integrated circuit includes a large number of active devices, such as transistors, in an integrated circuit substrate, such as a semiconductor substrate. As is also well known to those having skill in the art, integrated circuit fabrication may include a large number of masking steps, which selectively expose regions of an integrated circuit substrate and/or layers thereon. Implantation of dopants and/or other species into the integrated circuit substrate and/or layers thereon may be provided through the exposed regions of the mask. For example, in fabricating integrated circuit field effect transistors, also referred to as insulated gate field effect transistors, MOSFETs or CMOS devices, it is known to selectively implant dopants into active regions of an integrated circuit substrate using various masks. Unfortunately, as the integration density and/or complexity of integrated circuit devices continues to increase, the number of masking steps may undesirably increase and/or it may be difficult to use conventional materials to form these devices.

In fabricating an integrated circuit transistor, it is known to use a first mask and first gate spacers to form source/drain extension regions, also referred to as extension regions or halo regions. It is also known to use a second mask, and second gate spacers, to form the source/drain regions.

In particular, referring to FIG. 1A, a first mask 100 may be used in implanting first dopants 110, to form extension regions 130 on opposite sides of an insulated gate 120, while masking other devices 140. Later, as shown in FIG. 1B, a second mask 150 may be used in connection with sidewall spacers 160, to implant source/drain dopants 180, and thereby form source/drain regions 170.

SUMMARY OF THE INVENTION

Integrated circuit transistors may be fabricated, according to some embodiments of the present invention, by forming in an integrated circuit substrate a first active area including a first insulated gate thereon and a second active area including a second insulated gate thereon. An implant-blocking mask is selectively formed on the second active area. Extension dopants are then implanted into the first active area on opposite sides of the first insulated gate, to form source and drain extension regions, while the implant-blocking mask blocks the dopants from the second active area. An anti-reflective coating is then formed on the first active area. The anti-reflective coating is then directionally etched on the first active area, to form anti-reflective coating sidewall spacers on opposite sidewalls of the first insulated gate, while retaining the implant-blocking mask on the second active area. Source/drain dopants are then implanted into the first active area on opposite sides of the first insulated gate, to form source and drain regions, while the implant-blocking mask blocks the source/drain dopants from the second active area, and the anti-reflective coating sidewall spacers block at least some of the source/drain dopants from the first active area beneath the anti-reflective coating sidewall spacers and the source and drain extension regions remain beneath the anti-reflective coating sidewall spacers. The implant-blocking mask and the anti-reflective coating sidewall spacers are then removed.

In some embodiments of the invention, selectively forming an implant-blocking mask on the second active area is performed by blanket forming an implant-blocking layer on the first and second active areas and removing the implant-blocking layer from the first active area. In some embodiments, the implant-blocking mask comprises photoresist. In these embodiments, the anti-reflective coating on the first active area may be etched to form the anti-reflective coating sidewall spacers by selectively directionally etching the anti-reflective coating relative to the photoresist.

In some embodiments of the invention, forming an implant-blocking mask is preceded by forming oxide sidewall spacers on sidewalls of the first and second insulated gates. Implanting extension dopants is then performed by implanting extension dopants into the first active area at an oblique angle, to extend the source and drain extension regions beneath the oxide sidewall spacers. In these embodiments, directionally etching the anti-reflective coating on the first active area is performed, to form anti-reflective coating sidewall spacers on the oxide sidewall spacers on opposite sidewalls of the first gate, while retaining the implant-blocking mask on the second active area. The implant-blocking mask and the anti-reflective coating sidewall spacers may then be removed while retaining the oxide sidewall spacers. Nitride sidewall spacers may then be formed on the oxide sidewall spacers that were retained.

In other embodiments of the present invention, the anti-reflective coating is formed on the first active area and the implant-blocking mask is formed on the second active area. The anti-reflective coating is then directionally etched on the first active area, while simultaneously removing the anti-reflective coating from the implant-blocking mask on the second active area, to form the anti-reflective coating sidewall spacers, while retaining the implant-blocking mask on the second active area.

In still other embodiments of the present invention, an anti-reflective coating sidewall spacer can be used for any desired implant-blocking in fabricating an integrated circuit transistor. Thus, in these embodiments, a first active area including a first insulated gate and a second active area including a second insulated gate are formed, and an implant-blocking mask is formed on the second active area. An anti-reflective coating is formed on the first active area and is directionally etched to form anti-reflective coating sidewall spacers on opposite sidewalls of the first insulated gate, while retaining the implant-blocking mask on the second active area. Source/drain dopants are then implanted into the first active area on opposite sides of the first insulated gate, to form source and drain regions, while the implant-blocking mask blocks the source/drain dopants from the second active area and the anti-reflective coating sidewall spacers block at least some source/drain dopants from the first active area beneath the anti-reflective coating sidewall spacers. The implant-blocking mask and the anti-reflective coating sidewall spacers may then be removed. The implant-blocking mask may be formed as was described above. Oxide sidewall spacers and/or nitride sidewall spacers also may be provided as was described above, and the anti-reflective coating may be formed on the first active area, as was described above.

Accordingly, some embodiments of the present invention may use a patterned anti-reflective coating as a selective implant-blocking layer during fabrication of an integrated circuit transistor. In some embodiments, the patterned anti-reflective coating is used as a gate sidewall spacer, to block at least some dopants from the integrated circuit substrate beneath the gate sidewall spacer. A patterned anti-reflective coating also may be used as a selective implant-blocking layer in other integrated circuit fabrication processes.

BRIEF DESCRIPTION OF THE EMBODIMENTS

DETAILED DESCRIPTION

Figure 1A:
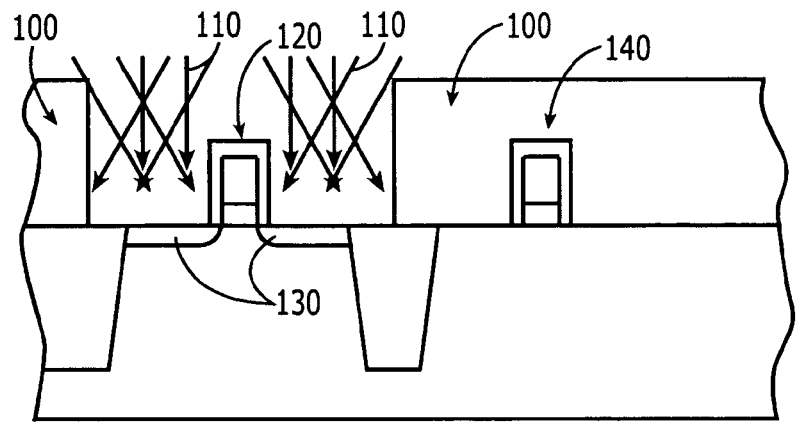
FIGS. 1A and 1B are side cross-sectional views of conventional methods of fabricating integrated circuit transistors during intermediate fabrication steps.
Figure 1B:
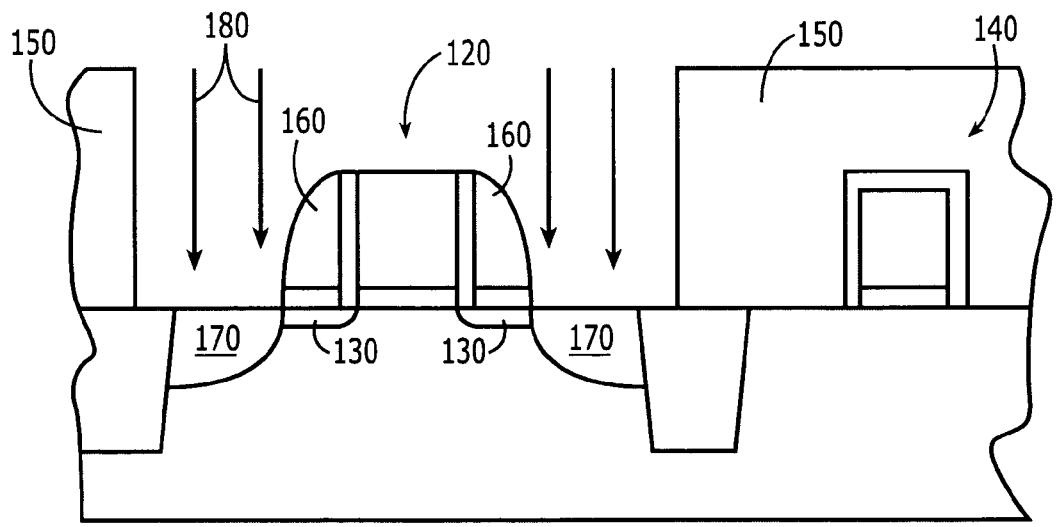

The invention will be described more fully hereinafter with reference to the accompanying drawings, in which example embodiments of the invention are shown. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. In the drawings, the size and relative sizes of layers and regions may be exaggerated for clarity. Moreover, each embodiment described and illustrated herein includes its complementary conductivity type embodiment as well. Like numbers refer to like elements throughout.

It will be understood that when an element or layer is referred to as being "on", "connected to" and/or "coupled to" another element or layer, it can be directly on, connected or coupled to the other element or layer or intervening elements or layers may be present. In contrast, when an element is referred to as being "directly on," "directly connected to" and/or "directly coupled to" another element or layer, there are no intervening elements or layers present. As used herein, the term "and/or" may include any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms may be used to distinguish one element, component, region, layer and/or section from another region, layer and/or section. For example, a first element, component, region, layer and/or section discussed below could be termed a second element, component, region, layer and/or section without departing from the teachings of the present invention.

Spatially relative terms, such as "beneath", "below", "lower", "above", "upper" and the like, may be used herein for ease of description to describe an element and/or a feature's relationship to another element(s) and/or feature(s) as illustrated in the figures. It will be understood that the spatially relative terms are intended to encompass different orientations of the device in use or operation in addition to the orientation depicted in the figures. For example, if the device in the figures is turned over, elements described as "below" and/or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular terms "a", "an" and "the" are intended to include the plural forms as well, unless the context clearly indicates otherwise. It will be further understood that the terms "comprises," "comprising," "includes" and/or "including" when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, may be expected. Thus, the disclosed example embodiments of the invention should not be construed as limited to the particular shapes of regions illustrated herein unless expressly so defined herein, but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention, unless expressly so defined herein.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Some embodiments of the present invention may arise from recognition that a single mask may be used as an implant-blocking mask on a second active area when implanting source/drain extension dopants into a first active area and also when implanting source/drain dopants into the first active area. Accordingly, the number of masks and masking steps may be reduced.

Moreover, in some embodiments of the present invention, a patterned Anti-Reflective Coating (ARC) is used as a selective implant-blocking layer during fabrication of an integrated circuit transistor. Anti-Reflective Coatings (ARCs) are well known to those having skill in the art and may also be referred to as Bottom Anti-Reflective Coatings (BARC) and/or Top Anti-Reflective Coatings (TARC). Anti-reflective coatings are generally used above and/or below photoresists to provide greater optical reflectivity control and thereby allow improved optical imaging. The manufacture and use of anti-reflective coatings for optical purposes is well known to those having skill in the art, and need not be described further herein.

In some embodiments, the anti-reflective coating may be used as a gate sidewall spacer to block at least some dopants from an integrated circuit substrate beneath the gate sidewall spacer. Thus, an anti-reflective coating that generally is formed on a photoresist for optical purposes may also be used to form a sidewall spacer for implant-blocking purposes.

FIGS. 2-6 are side cross-sectional views of methods of fabricating integrated circuit transistors according to various embodiments of the present invention during intermediate fabrication steps according to various embodiments of the present invention.

Figure 2:
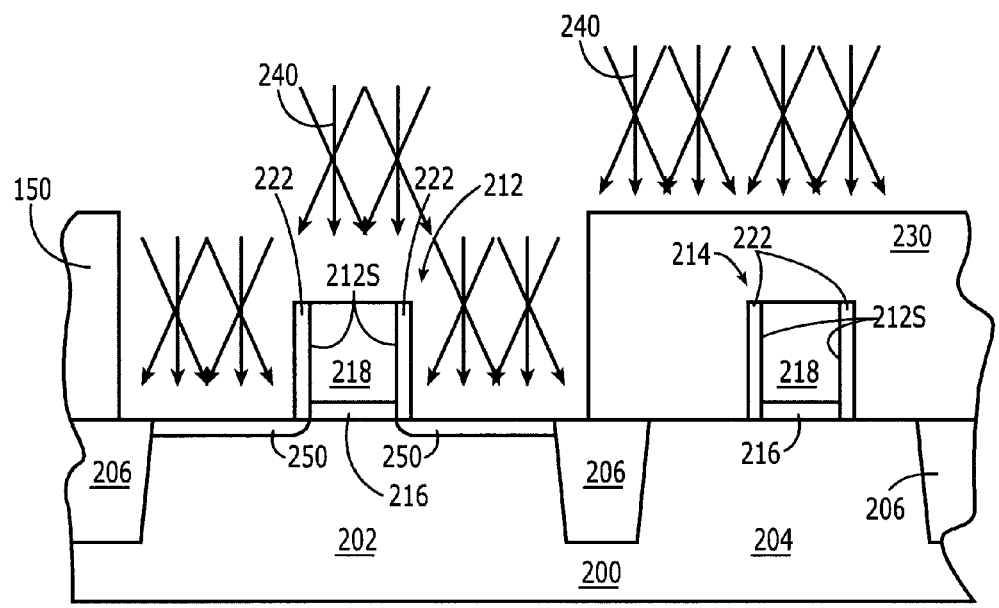
FIGS. 2-6 are side cross-sectional views of integrated circuit transistors fabricated according to various embodiments of the present invention during intermediate fabrication steps according to various embodiments of the present invention.

In particular, referring to FIG. 2, a first active area 202 and a second active area 204 are formed in an integrated circuit substrate 200. The integrated circuit substrate 200 may include a single element and/or compound semiconductor substrate which may include one or more epitaxial layers thereon, and/or may include a single element and/or compound semiconductor layer on a substrate. Examples of integrated circuit substrates 200 include silicon semiconductor substrates and semiconductor-on-insulator (SOI) substrates. The fabrication of integrated circuit substrates 200 is well known to those having skill in the art, and need not be described further herein. Moreover, the first and second active areas 202 and 204 may be defined using isolation regions 206, such as shallow trench isolation regions and/or other conventional techniques well known to those having skill in the art. The active areas 202 and 204 may be of the same conductivity type, or may be of opposite conductivity types to form CMOS devices.

Still referring to FIG. 2, the first active area 202 includes a first insulated gate 212 thereon, and the second active area 204 includes a second insulated gate 214 thereon. Each of the insulated gates 212 and 214 may include a gate insulation layer 216, which may be of the same and/or different composition and/or thickness, and a gate electrode 218, which may include one or more sublayers of the same and/or different compositions and/or thicknesses. The fabrication of insulated gates are well known to those having skill in the art, and need not be described further herein. As also shown in FIG. 2, the insulated gates 212, 214 may include first sidewall spacers 222 on opposite sidewalls 212$s$, 214$s$ of the first and second insulated gates 212, 214, respectively. The first sidewall spacers 222 may comprise silicon dioxide and may also be referred to as oxide sidewall spacers. The design and manufacture of the first sidewall spacers 222 are well known to those having skill in the art, and need not be described further herein.

Still referring to FIG. 2, an implant blocking mask 230 is selectively provided on the second active area 204, but not on the first active area 202. In some embodiments, the implant-blocking mask 230 may comprise photoresist and may be fabricated by blanket forming a layer of photoresist on the first and second active areas 202 and 204, and then removing the photoresist from the first active area 202.

Still referring to FIG. 2, extension dopants 240 are then implanted into the first active area 202 on opposite sides of the first gate 212, to form source and drain extension regions 250. As shown in FIG. 2, the implant-blocking mask 230 selectively blocks the dopants 240 from the second active area 204. As also shown in FIG. 2, the implantation of dopants 240 may be performed at an oblique angle relative to the substrate 200, so that the extension regions 250 extend beneath the first spacers 222. In other embodiments, however, the extension regions need not be implanted at an oblique angle and/or the extension regions 250 need not extend beneath the first spacers 222 and/or the insulated gate 212. The design and fabrication of extension regions 250 is well known to those having skill in the art and need not be described further herein. Moreover, the dopants 240 and the implantation parameters may be selected based on the desired conductivity type of the transistor and/or other design and/or process criteria well known to those having skill in the art.

Figure 3:
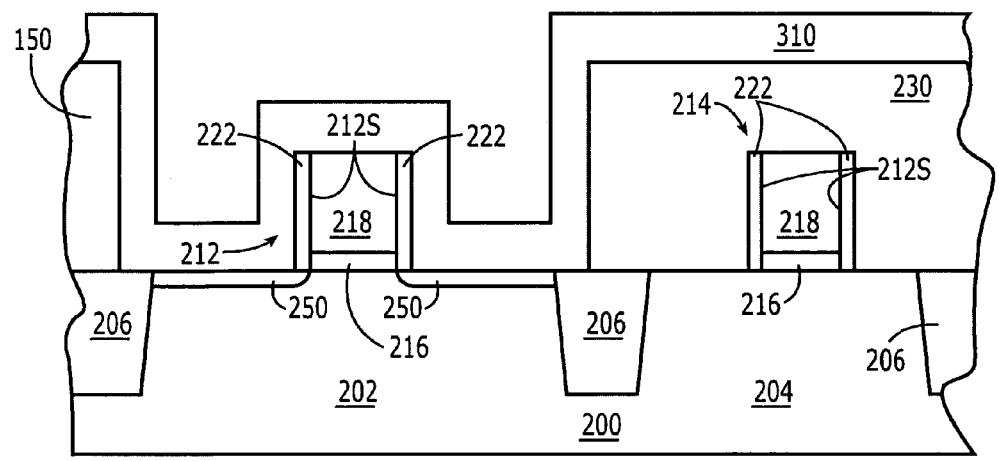

Referring now to FIG. 3, an anti-reflective coating 310 is formed on the first active area 202. In some embodiments, as shown in FIG. 3, the anti-reflective coating 310 may be blanket formed on both the first and second active areas 202 and 204.

Figure 4:
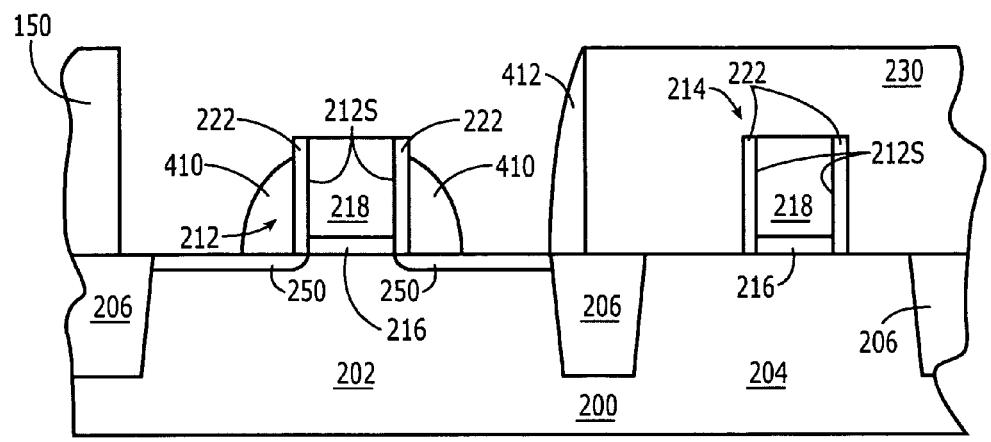

Referring now to FIG. 4, the anti-reflective coating 310 is then directionally etched to form anti-reflective coating sidewall spacers 410 on the opposite sidewalls 212$s$ of the first gate, while retaining the implant-blocking mask 230 on the second active area 204. Directional (isotropic) etching of the anti-reflective coating 310 to form the anti-reflective coating sidewall spacers 410 may be performed using reactive ion etching and/or other conventional directional etching techniques. As also shown in FIG. 4, a sidewall spacer 412 comprising anti-reflective coating material also may be formed on a sidewall of the implant-blocking mask 230. It will also be understood that when the implant-blocking mask 230 comprises photoresist, the directional etching of FIG. 4 may take place by selectively directionally etching the anti-reflective coating 310 of FIG. 3 relative to the photoresist implant-blocking mask 230. The selective etching of an anti-reflective coating relative to a photoresist is well known to those having skill in the art and need not be described further herein.

Figure 5:
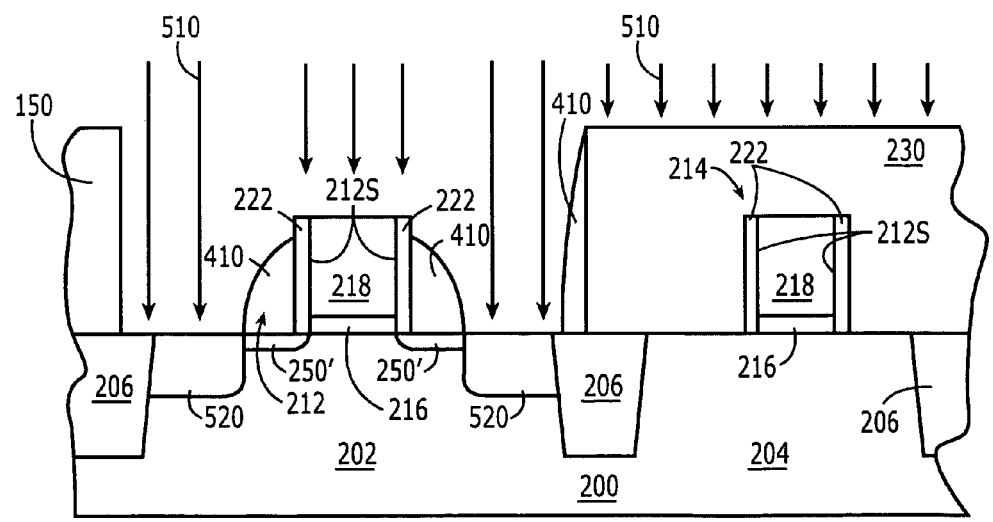

Referring now to FIG. 5, source/drain dopants 510 are then implanted into the first active area 202 on opposite sides of the first gate 212, to form source and drain regions 520, while the implant-blocking mask 230 blocks the source/drain dopants 510 from the second active area 204 and the anti-reflective coating sidewall spacers 410 block at least some source/drain dopants 510 from the first active area 202 beneath the anti-reflective coating sidewall spacers 410, and the source/drain extension regions 250' remain beneath the anti-reflective coating sidewall spacers 410. It will be understood by those having skill in the art that the source/drain dopants 510 and/or the implantation parameters may depend upon the desired characteristic of the transistor and/or the fabrication process. Thus, as shown in FIG. 5, the implant-blocking mask 230 may also be used to block implantation of source/drain dopants from the first active area 204, in addition to blocking implantation of halo implants 240 from the first active area 204, as was illustrated in FIG. 2.

Figure 6:
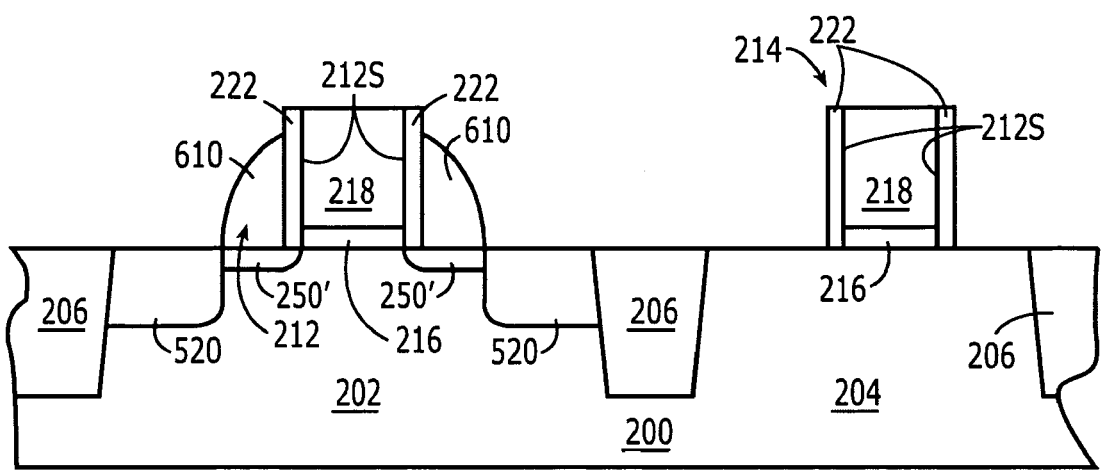

Finally, referring to FIG. 6, the implant-blocking mask 230 and the anti-reflective coating sidewall spacers 410 are removed. Removal of the implant-blocking mask 230 and the anti-reflective coating sidewall spacers 410 may be provided using dry/wet resist strip processes well known to those having skill in the art. In some embodiments, a nitride sidewall spacer 610 may then be formed for use in subsequent silicide contact formation using techniques well known to those having skill in the art. In some embodiments of FIG. 6, the oxide spacers 222 also may be removed. In other embodiments, the oxide spacers 222 may be retained, as shown in FIG. 6. In still other embodiments, the anti-reflective coating sidewall spacers 410 need not be removed but, rather, may be retained in the final device.

In other embodiments of the present invention, fabrication of the anti-reflective coating sidewall spacers 410 in FIG. 4 need not be preceded by formation of the extension regions in FIG. 2. Moreover, in some embodiments, the anti-reflective coating sidewall spacers 410 of FIG. 4 may be used in FIG. 5 to perform any desired implant of source/drain dopants, such as for the source/drain regions themselves, for extension regions, for contact regions and/or for any other doped regions associated with the source/drain. In yet other embodiments of the present invention, the anti-reflective coating sidewall spacers 410 of FIG. 4 may be used to block at least some dopants from beneath the gate sidewall spacer, without the use of an implant-blocking mask 230. In still other embodiments, patterned anti-reflective coatings may be used to selectively block implants when forming other regions not associated with source/drain regions of an insulated gate field effect transistor. Rather, a patterned anti-reflective coating may be used as a selective implant-blocking layer at any process step of integrated circuit transistor fabrication. Finally, embodiments of the invention as described herein may be combined in various combinations and subcombinations.

Accordingly, some embodiments of the present invention can reduce the total number of photomasks in insulated gate field effect transistor fabrication by using the same photomask in fabricating source/drain extension regions and source/drain regions of a field effect transistor, and/or can use an anti-reflective coating that is conventionally used for optical purposes, for implant-blocking purposes. More efficient methods of fabricating integrated circuit transistors may thereby be provided.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A method of fabricating an integrated circuit transistor comprising:
   forming in an integrated circuit substrate, a first active area including a first insulated gate thereon and a second active area including a second insulated gate thereon;
   selectively forming an implant-blocking mask on the second active area;
   implanting extension dopants into the first active area on opposite sides of the first insulated gate to form source and drain extension regions while the implant-blocking mask blocks the dopants from the second active area;
   forming an anti-reflective coating on the first active area;
   directionally etching the anti-reflective coating on the first active area to form anti-reflective coating sidewall spacers on opposite sidewalls of the first insulated gate, while retaining the implant-blocking mask on the second active area;
   implanting source/drain dopants into the first active area on opposite sides of the first insulated gate to form source and drain regions while the implant-blocking mask blocks the source/drain dopants from the second active area and the anti-reflective coating sidewall spacers block at least some source/drain dopants from the first active area beneath the anti-reflective coating sidewall spacers and the source and drain extension regions remain beneath the anti-reflective coating sidewall spacers; and
   removing the implant-blocking mask and the anti-reflective coating sidewall spacers.

2. A method according to claim 1 wherein selectively forming an implant-blocking mask on the second active area comprises:
   blanket forming an implant-blocking layer on the first and second active areas; and
   removing the implant-blocking layer from the first active area.

3. A method according to claim 1:
   wherein forming an implant-blocking mask is preceded by forming oxide sidewall spacers on sidewalls of the first and second insulated gates;
   wherein implanting extension dopants into the first active area on opposite sides of the first insulated gate to form source and drain extension regions comprises implanting extension dopants into the first active area at an oblique angle to extend the source and drain extension regions beneath the oxide sidewall spacers; and
   wherein directionally etching the anti-reflective coating on the first active area comprises directionally etching the anti-reflective coating on the first active area to form anti-reflective coating sidewall spacers on the oxide sidewall spacers on opposite sidewalls of the first insulated gate, while retaining the implant-blocking mask on the second active area.

4. A method according to claim 3:
   wherein removing the implant-blocking mask and the anti-reflective coating sidewall spacers comprises removing the implant-blocking mask and the anti-reflective coating sidewall spacers while retaining the oxide sidewall spacers; and
   wherein removing the implant-blocking mask and the anti-reflective coating sidewall spacers is followed by forming nitride sidewall spacers on the oxide sidewall spacers that were retained.

5. A method according to claim 1 wherein the implant-blocking mask comprises photoresist.

6. A method according to claim 5 wherein directionally etching the anti-reflective coating on the first active area to form anti-reflective coating sidewall spacers on opposite sidewalls of the first insulated gate, while retaining the implant-blocking mask on the second active area, comprises selectively directionally etching the anti-reflective coating relative to the photoresist.

7. A method according to claim 1:
   wherein forming an anti-reflective coating on the first active area comprises blanket forming an anti-reflective coating on the first active area and on the implant-blocking mask on the second active area; and
   wherein directionally etching the anti-reflective coating on the first active area comprises directionally etching the anti-reflective coating on the first active area while simultaneously removing at least some of the anti-reflective coating from the implant-blocking mask on the second active area to form the anti-reflective coating sidewall spacers on opposite sidewalls of the first gate and while retaining the implant-blocking mask on the second active area.

8. A method of fabricating an integrated circuit transistor comprising:
   forming in an integrated circuit substrate, a first active area including a first insulated gate thereon and a second active area including a second insulated gate thereon;
   selectively forming an implant-blocking mask on the second active area;
   forming an anti-reflective coating on the first active area;
   directionally etching the anti-reflective coating on the first active area to form anti-reflective coating sidewall spacers on opposite sidewalls of the first insulated gate, while retaining the implant-blocking mask on the second active area;
   implanting source/drain dopants into the first active area on opposite sides of the first insulated gate to form source and drain regions while the implant-blocking mask blocks the source/drain dopants from the second active area and the anti-reflective coating sidewall spacers block at least some source/drain dopants from the first active area beneath the anti-reflective coating sidewall spacers; and removing the implant-blocking mask and the anti-reflective coating sidewall spacers.

9. A method according to claim 8 wherein selectively forming an implant-blocking mask on the second active area comprises:

blanket forming an implant-blocking layer on the first and second active areas; and removing the implant-blocking layer from the first active area.

10. A method according to claim 8:

wherein forming an implant-blocking mask is preceded by forming oxide sidewall spacers on sidewalls of the first and second insulated gates; and wherein directionally etching the anti-reflective coating on the first active area comprises directionally etching the anti-reflective coating on the first active area to form anti-reflective coating sidewall spacers on the oxide sidewall spacers on opposite sidewalls of the first insulated gate, while retaining the implant-blocking mask on the second active area.

11. A method according to claim 10:

wherein removing the implant-blocking mask and the anti-reflective coating sidewall spacers comprises removing the implant-blocking mask and the anti-reflective coating sidewall spacers while retaining the oxide sidewall spacers; and wherein removing the implant-blocking mask and the anti-reflective coating sidewall spacers is followed by forming nitride sidewall spacers on the oxide sidewall spacers that were retained.

12. A method according to claim 8 wherein the implant-blocking mask comprises photoresist.

13. A method according to claim 12 wherein directionally etching the anti-reflective coating on the first active area to form anti-reflective coating sidewall spacers on opposite sidewalls of the first insulated gate, while retaining the implant-blocking mask on the second active area, comprises selectively directionally etching the anti-reflective coating relative to the photoresist.

14. A method according to claim 8:

wherein forming an anti-reflective coating on the first active area comprises blanket forming an anti-reflective coating on the first active area and on the implant-blocking mask on the second active area; and wherein directionally etching the anti-reflective coating on the first active area comprises directionally etching the anti-reflective coating on the first active area while simultaneously removing the anti-reflective coating from the implant-blocking mask on the second active area to form anti-reflective coating sidewall spacers on opposite sidewalls of the first insulated gate and while retaining the implant-blocking mask on the second active area.

15. A method of fabricating an integrated circuit transistor comprising:

forming in an integrated circuit substrate, an active area including an insulated gate thereon;

forming an anti-reflective coating on the active area;

directionally etching the anti-reflective coating on the active area to form anti-reflective coating gate sidewall spacers on opposite sidewalls of the insulated gate; and implanting dopants into the active area on opposite sides of the insulated gate while the anti-reflective coating gate sidewall spacers block at least some dopants from the active area beneath the anti-reflective coating sidewall spacers.

* * * * *